(12) United States Patent
Madson et al.

(10) Patent No.: US 6,391,699 B1
(45) Date of Patent: May 21, 2002

(54) METHOD OF MANUFACTURING A TRENCH MOSFET USING SELECTIVE GROWTH EPITAXY

(75) Inventors: Gordon K. Madson; Joelle Sharp, both of Herriman, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/586,720

(22) Filed: Jun. 5, 2000

(51) Int. Cl.[7] .......................................... H01L 21/8238
(52) U.S. Cl. ....................................... 438/212; 257/328
(58) Field of Search ................................ 438/268, 269, 438/270, 212; 257/328, 330

(56) References Cited

U.S. PATENT DOCUMENTS 5,140,388 A * 8/1992 Bartelink ............... 357/23.4
6,071,794 A * 6/2000 Lin et al. ................ 438/424
6,204,098 B1 * 3/2001 Anceau .................. 438/149
6,236,099 B1 * 5/2001 Boden, Jr. .............. 257/495

* cited by examiner

Primary Examiner—David Nelms
Assistant Examiner—Quoc Hoang
(74) Attorney, Agent, or Firm—Townsend and Townsend and Crew LLP; William E. Winters

(57) ABSTRACT

A method of creating a thermally grown oxide of any thickness at the bottom of a silicon trench. A dielectric (e.g. oxide) pillar of a predetermined thickness is formed on a semiconductor substrate. A selective epitaxial growth (SEG) process is used to form an epitaxial layer around and over the oxide pillars. A trench is patterned and etched through the SEG layer and in alignment with the oxide pillar such that the trench terminates at the top of the oxide pillar.

13 Claims, 9 Drawing Sheets

METHOD OF MANUFACTURING A TRENCH MOSFET USING SELECTIVE GROWTH EPITAXY

BACKGROUND OF THE INVENTION

The present invention relates in general to semiconductor technology, and in particular, to a method of manufacturing a trench doubly-diffused Metal Oxide Semiconductor Field Effect transistor (trench DMOS transistor) using selective growth epitaxy.

A cross-sectional view of a typical n-channel trench DMOS transistor 10 is shown in FIG. 1. It includes an n-type substrate 100 upon which an n-type epitaxial layer 102 is typically grown. A p-type body layer 108 covers epitaxial layer 102 and one or more trenches 100 extend through the body layer 108 and a portion of the epitaxial layer 102. Gate oxide layer 104 lines the sidewalls and bottom of each trench 100 and a conductive material 106, typically doped polysilicon, lines gate oxide layer 104 and fills each trench 100. N+ source regions 110 flank each trench 100 and extend a predetermined distance into body layer 108. Heavy body regions 112 are positioned within body layer 108 and between source regions 110 and extend a predetermined distance into body layer 108. Finally, dielectric caps 114 cover the filled trenches 100 and also partially cover the source regions 110.

During fabrication of the trench DMOS transistor 10, an anisotropic etch step is typically performed to form trenches 100. An anisotropic etch is used, as opposed to an isotropic etch, since an anisotropic etch etches substantially in one direction, which in this example, is vertical and downward. A drawback of administering an anisotropic etch is that the sidewalls become damaged, i.e. silicon surface defects are created. This leads to a degraded gate oxide 104 to trench sidewall interface and a concomitant degradation in the quality of the gate oxide 104 itself.

After trenches 100 are formed, a dielectric layer such as silicon dioxide (or oxide) is typically grown over the bottom and sidewalls of the trench to form a gate oxide. Simultaneous formation of the oxide at the bottom and on the sidewalls of the trenches limits the thickness of the oxide that can be grown on the bottom of the trenches 100, since growth on the sidewalls eventually pinches off growth on the bottom of the trenches 100. A thin oxide on the bottom of the trench is undesirable since it leads to a lower breakdown voltage of the device and an undesirably large gate-to-drain capacitance.

Limiting oxide growth on the trench sidewalls while growing oxide on the bottom of the trench can be accomplished by using a masking technique such as LOCOS (Local Oxidation of Silicon). Unfortunately, this sidewall masking technique creates problems such as oxide stress near the corners of a trench and formation of a "bird's head" at the upper and lower corners of the trench. These bird's heads are undesirable. For example, the presence of bird's heads at the upper trench corners leads to step-coverage problems of overlying metal layers, due to the uneven surface topology caused by the bird's heads. While an etchback of the LOCOS layer can somewhat reduce the presence of the bird's head, there still remains the problem of reliably growing an oxide layer on the bottom of the trench to a predetermined thickness.

SUMMARY OF THE INVENTION

In a first aspect of the invention, a method of forming a trench in a semiconductor substrate is disclosed. The method comprises the steps of: providing a semiconductor substrate; forming a pillar of dielectric material on the substrate, the pillar having a top surface and a predetermined thickness; forming a semiconductor layer over the substrate and around and over the top surface of the pillar; forming a masking layer over the semiconductor layer, the masking layer having a trench opening access that exposes a portion of an upper surface of the semiconductor layer and being in substantial vertical alignment with the pillar; and forming a trench through the trench opening access by anisotropically etching the semiconductor layer down to the top surface of the pillar. Preferably, the dielectric pillar is silicon dioxide and is formed via thermal oxidation.

In a second aspect of the invention, a method of manufacturing a trench MOSFET is disclosed. The method comprises the steps of: providing a semiconductor substrate having a first conductivity type; forming a first semiconductor layer over the substrate, the first semiconductor layer having the first conductivity type; forming a plurality of dielectric pillars across a surface of the first semiconductor layer, each pillar having a top surface and predetermined height; forming a second semiconductor layer having the first conductivity type over the first semiconductor layer and around and over the top surfaces of the pillars; forming a third semiconductor layer over the second semiconductor layer, the third semiconductor layer having a second conductivity type; forming a masking layer over the third semiconductor layer, the masking layer defining a plurality of trench opening accesses that expose portions of an upper surface of the third semiconductor layer and being in substantial vertical alignment with the pillars; forming a plurality of trenches through the trench opening accesses by anisotropically etching the third semiconductor layer and a portion of the second semiconductor layer and down to the top surfaces of the pillars; removing the masking layer; lining sidewalls of the trenches with a dielectric material; and lining the dielectric material and filling the trenches with a conductive material.

In an alternative embodiment to the second aspect of the invention source and heavy body regions are formed by standard implant and drive techniques and a dielectric cap is then formed over openings to the trenches and over a portion of the source regions.

In a third aspect of the invention a trench structure is disclosed, the trench structure comprising: A trench structure, comprising: a semiconductor substrate; a first semiconductor layer formed over the substrate; a second semiconductor layer selectively formed over the first semiconductor layer; a trench extending from an exposed primary surface of the second semiconductor layer and through the first and second semiconductor layers; and a dielectric column positioned at the bottom of the trench, the column having a substantially flat upper surface and a precisely controlled and predetermined thickness. Preferably the dielectric column is formed by thermal oxidation.

In a fourth aspect of the invention a trench MOSFET is disclosed, the trench MOSFET, comprising: a substrate having a first conductivity type; a first semiconductor layer having the first conductivity type formed over the substrate; a second semiconductor layer having the first conductivity type selectively formed over the first semiconductor layer; a third semiconductor layer having a second conductivity type selectively formed over the second semiconductor layer; a plurality of trenches extending from an exposed primary surface of the third semiconductor layer and through the third and second semiconductor layers, each trench defined by a bottom and walls; a dielectric column positioned at the bottom of each trench, the column having a substantially flat upper surface and a precisely controlled and predetermined thickness; a dielectric material lining the walls of the trenches; and a conductive material lining the dielectric material and filling the trenches.

In a fifth aspect of the invention dielectric caps are formed over openings of the trenches in the trench MOSFET described in the previous paragraph. These caps isolate the source regions from the gate region of the trench MOSFET. Each cap has lateral dimensions that are substantially equal to the lateral dimensions of the trenches. These dimensions allow a lower trench-to-trench pitch than what can be realized in prior art trench MOSFETs.

A further understanding of the nature and advantages of the inventions herein may be realized by reference to the remaining portions of the specification and the attached drawings.

DESCRIPTION OF THE SPECIFIC EMBODIMENTS

In a first embodiment of the present invention a novel method of creating a thermally grown dielectric such as silicon dioxide (or oxide) of any thickness at the bottom of a silicon trench is disclosed. Unlike prior art attempts, the oxide is grown prior to formation of the trench. Pillars of oxide are formed on the surface of the substrate. A selective epitaxial growth (SEG) process is used to form an epitaxial layer around the oxide pillars. Trenches are then patterned and etched in alignment with the pillars such that the trenches terminate on the top of the oxide pillars. This method is described in greater detail below.

Figure 1:
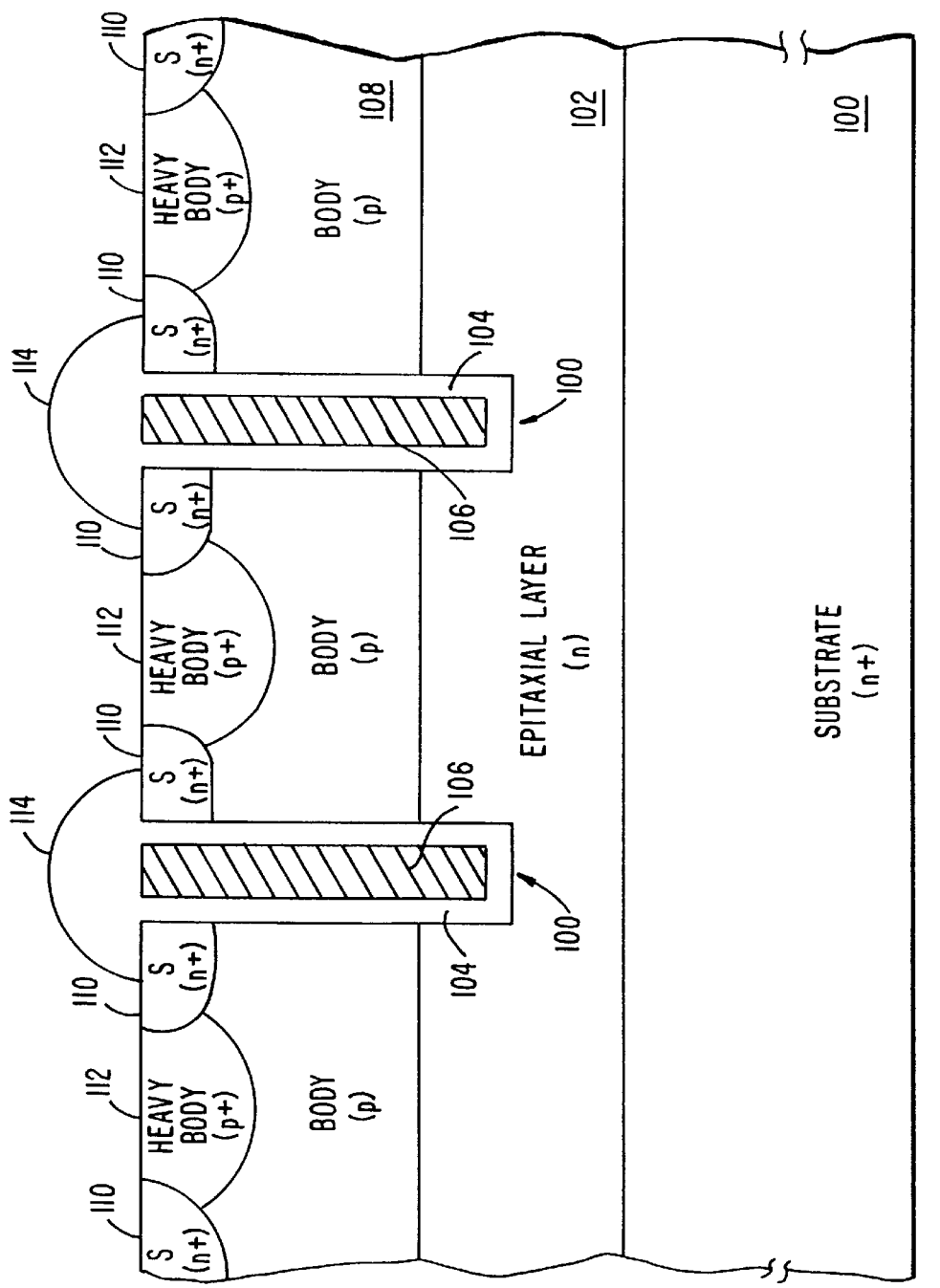
FIG. 1 is a cross-sectional view of a typical trench MOSFET.
Figure 2:
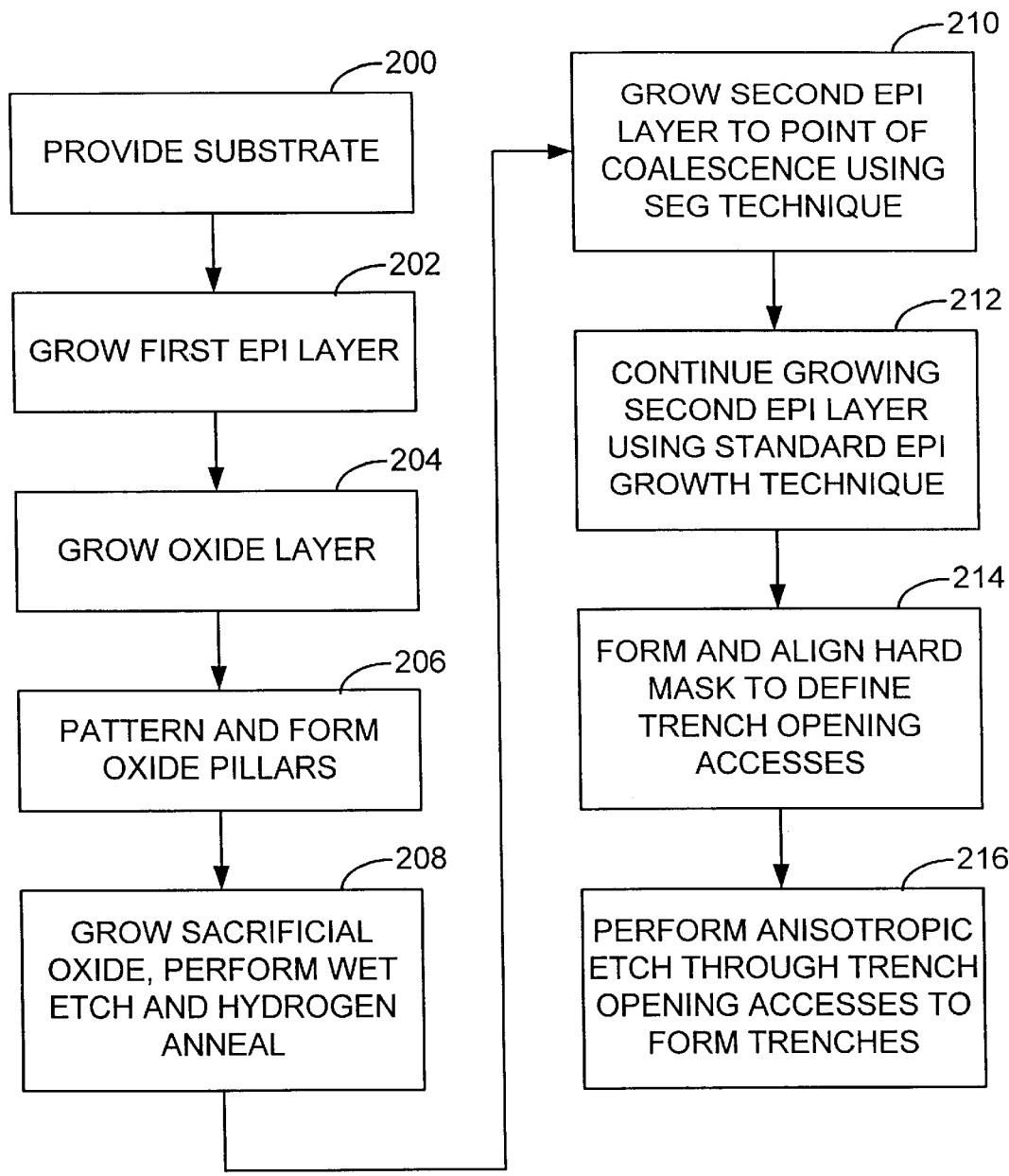
FIG. 2 is a process flow diagram showing exemplary process steps for manufacturing a trench according to a method of the present invention.

Referring to FIG. 2, there is shown a flow diagram illustrating an exemplary process flow for manufacturing a trench having a thermally grown gate oxide of precisely controlled dimensions. The following description of the process flow is only exemplary and one skilled in the art would understand that the scope of the invention is not limited to this specific example. In particular, while the trench in this example is formed in an n-type substrate, it should be understood that the doping type of the substrate and other layers is merely exemplary and not limiting. Additionally, processing conditions such as temperature, pressure, layer thicknesses, etc., could vary without departing from the spirit of the invention. A detailed description of the process flow in FIG. 2 is now described in connection with FIGS. 3A through 3H.

Figure 3A:
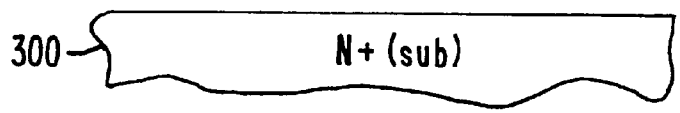
FIGS. 3A–3H are cross-sectional illustrations of the structure formed at various points in the process of FIG. 2.
Figure 3B:
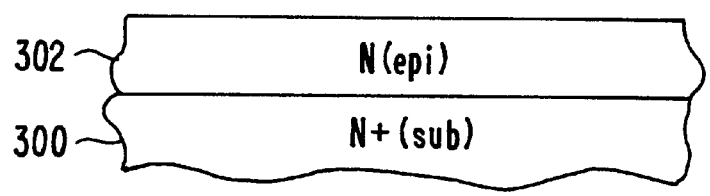
Figure 3C:
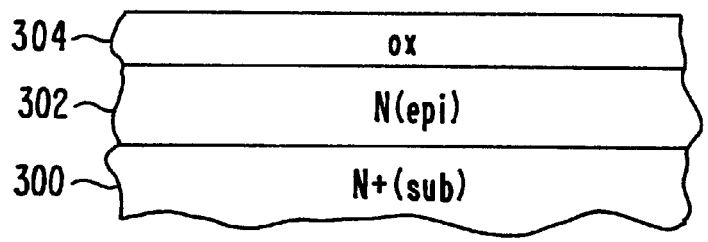

The first step in the process, step 200, is to provide a substrate 300, as shown in FIG. 3A, the substrate having a standard thickness of, for example, 700 μm and resistivity of, for example, 5 mΩ-cm. In step 202, a first epitaxial layer 302 is grown over the substrate, as shown in FIG. 3B. At step 204, an oxide layer 304 is formed, preferably by a process of thermal oxidation, from the exposed surface of the first epitaxial layer 302. A cross-section of the structure formed at this juncture in the process is shown in FIG. 3C.

Figure 3D:
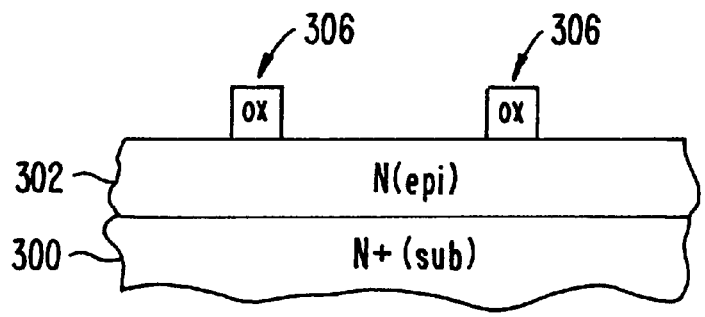

After oxide layer 304 has been formed, in step 206, oxide layer 304 is patterned and then etched by, for example, use of a photolithographic process, as is known in the art, to form oxide pillars 306 as shown in FIG. 3D.

Next, in step 208, a short sacrificial oxidation, having a thickness in this example about 0.03 μm is formed over the exposed areas of the first epitaxial layer 302. Then the sacrificial oxide is wet etched back to the epitaxial layer surface and the resulting structure is annealed in a hydrogen ambient to prepare the exposed epitaxial layer for formation of a second epitaxial layer. This step, 208, is optional and is not needed if the etched surface has no residual oxide or etch defects.

Figure 3E:
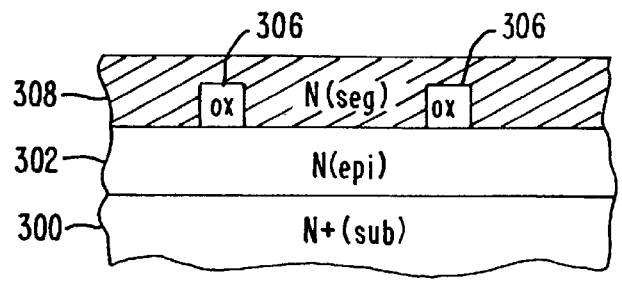

At step 210, a first portion 308 of a second epitaxial layer is formed. Preferably, formation of the first portion 308 is done using a process known as selective epitaxial growth (SEG). SEG is achieved upon a single crystal material, such as silicon, by providing a silicon source with a halide compound in it (e.g. Si source with HCl). The halide compound enhances the surface mobility of the silicon atoms in the silicon source so that they are more able to migrate to sites on the material where nucleation is favored. The first portion 308 of the second epitaxial layer is grown to the point of coalescence, i.e., to the point where the silicon growing on both sides of the oxide pillars 306 meet after growing above the top of the oxide pillars 306. The structure at this point in the fabrication process is shown in FIG. 3E.

Figure 3F:
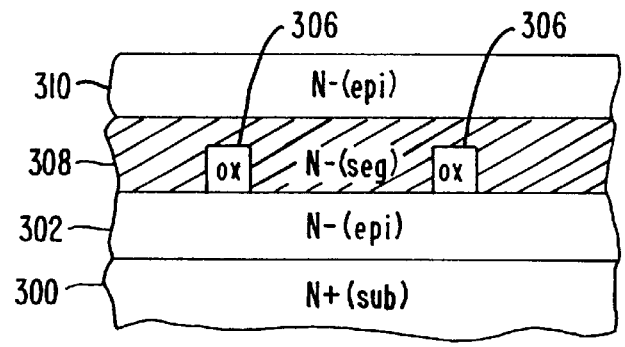
Figure 3G:
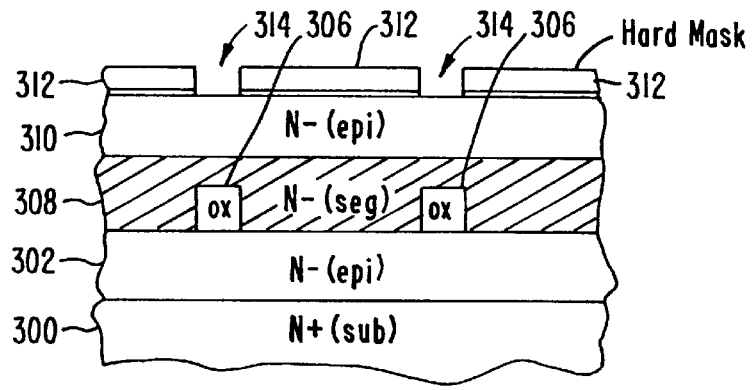

After coalescence is achieved, the halide source, in this example HCl gas, is turned off and in step 212, a second portion 310 of the second epitaxial layer is grown using a standard epitaxial growth technique. The structure at this point in the fabrication process is shown in FIG. 3F.

Next, at step 214 a hard mask 312 comprised of, for example, a nitride layer, preferably padded by an underlying pad oxide layer, is formed over the exposed surface of the second portion 310 of the second epitaxial layer and then patterned and selectively etched to form trench opening accesses 314, which are aligned with the oxide pillars 306 embedded below in the structure.

Figure 3H:
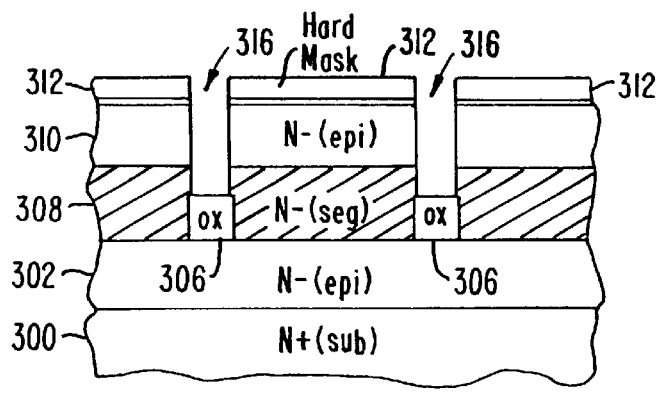

Next, at step 216, an anisotropic etch is performed through the trench opening accesses 314 to create trenches 316. Typically, the anisotropic etch is in the form of a plasma, which is an almost neutral mixture of energetic molecules, ions and electrons that have been excited in a radio-frequency electric field. Different gases are used depending on the material to be etched. The principal consideration is that the reaction products must be volatile. For etching silicon dioxide, the reactants may be, for example, Ar, $CF_4$, and $CHF_3$ the pressure may be, for example, 800 mT and the duration of the etch may be approximately 150 seconds. The structure following step 216 is shown in FIG. 3H.

Figure 4:
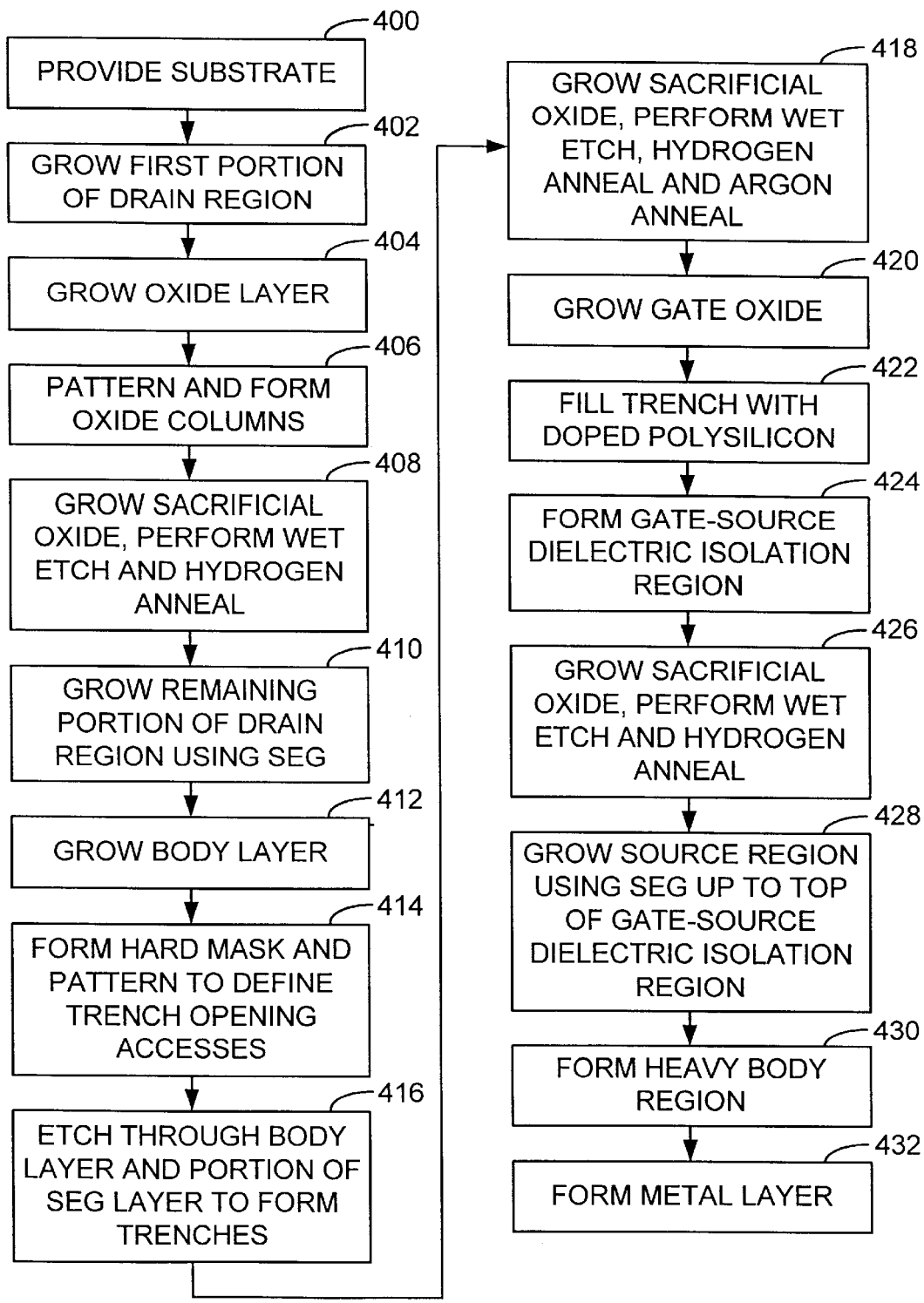
FIG. 4 is a process flow diagram showing exemplary process steps for manufacturing a trench MOSFET according to a method of the present invention.

A second aspect of the invention relates to using the method of forming a trench described above in the process of fabricating a trench DMOS transistor. A process flow diagram showing the steps of an exemplary method of fabricating a trench DMOS transistor according to the present invention is shown in FIG. 4. The following description of the process flow is only exemplary and it should be understood that the scope of the invention is not limited to this specific example. In particular, while the trench DMOS transistor described in this example is an n-channel device, a p-channel device could also be made by simply changing dopant types of the various layers. Additionally, processing conditions such as temperature, pressure, layer thicknesses, etc. could be possibly varied, without departing from the spirit of the invention. A detailed description of the process flow in FIG. 4 is now described in connection with FIGS. 5A through 5K.

Figure 5A:
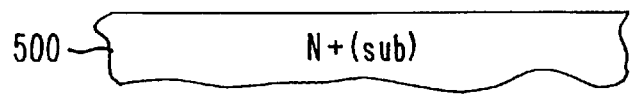
FIGS. 5A–5K are cross-sectional illustrations of the trench MOSFET structure formed at various points in the process of FIG. 4.
Figure 5B:
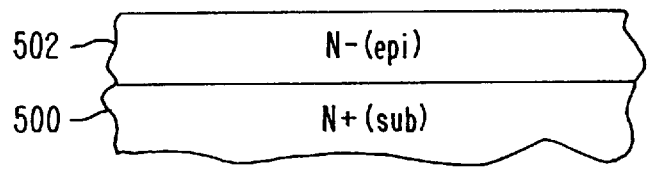

The first step in the process, step 400, is to provide a substrate 500 having a standard substrate thickness (700 $\mu$m) and resistivity as shown in FIG. 5A. In step 502, a first portion 502 of the drain region for the trench DMOS transistor is grown over substrate 500. The structure following step 502 is shown in FIG. 5B.

Figure 5C:
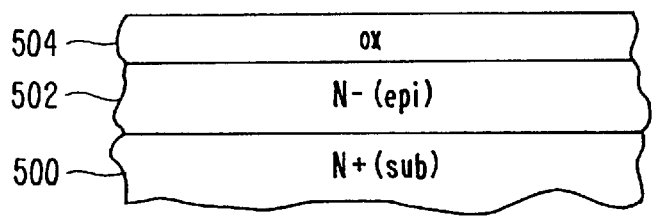
Figure 5D:
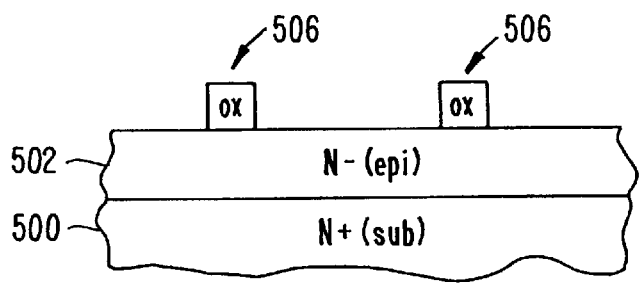

In step 404 a thermal oxide layer 504 is grown from the first portion 502 of the drain region as shown in FIG. 5C. Then, in step 406 oxide layer is patterned and etched using standard photolithography to form oxide pillars 506 as is shown in FIG. 5D.

Next, in step 408, a sacrificial oxidation (0.03 $\mu$m) and wet etch is performed, followed by a hydrogen anneal to prepare the exposed surface of the first portion 502 of the drain region for selective epitaxial growth (SEG).

Figure 5E:
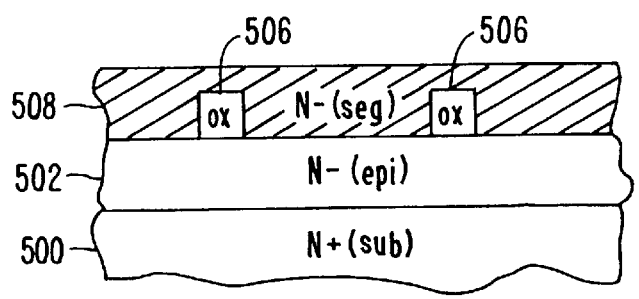

In step 410, the remaining portion 508 of the drain region is grown using SEG. The remaining portion 508 of the drain region is grown over the tops of oxide pillars 506 to the point of coalescence. The structure following this step in the process is shown in FIG. 5E.

Figure 5F:
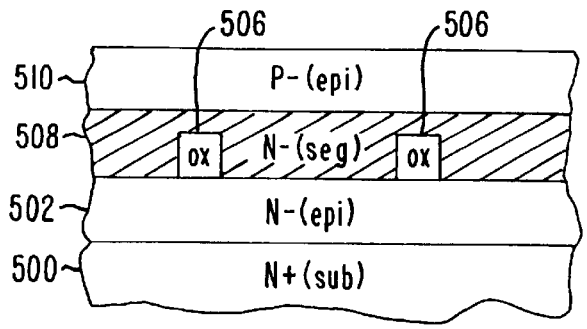

After the desired drain thickness is obtained, a body region 510 is grown over the top surface of the remaining portion 508 of the drain region to a thickness of about 0.6 $\mu$m. This step 412 and the preceding step 410 could be performed in situ. This is accomplished by terminating the SEG process once the desired drain thickness is obtained and switching to non-selective epitaxial growth and a different doping source (e.g. boron) to form the body region 510 in step 412. The structure following step 412 is shown in FIG. 5F.

Figure 5G:
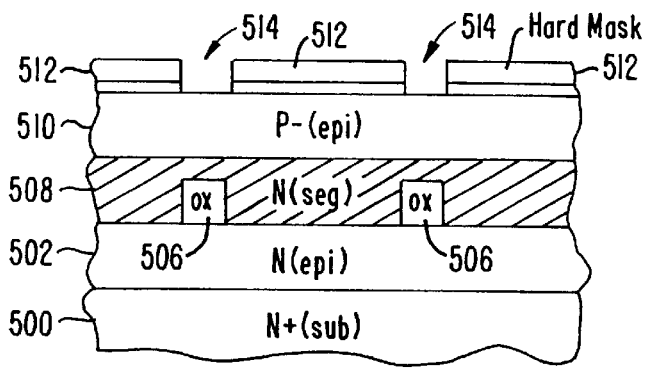

In step 414, a hard mask is formed over the body region 510. Preferably the hard mask is comprised of a nitride layer and an underlying pad oxide layer. Once formed over the body region 510, the hard mask is patterned and etched using standard photolithography to reveal trench opening accesses 514. As shown in FIG. 5G, the trench opening accesses 514 are in vertical alignment with the buried oxide pillars 506.

Figure 5H:
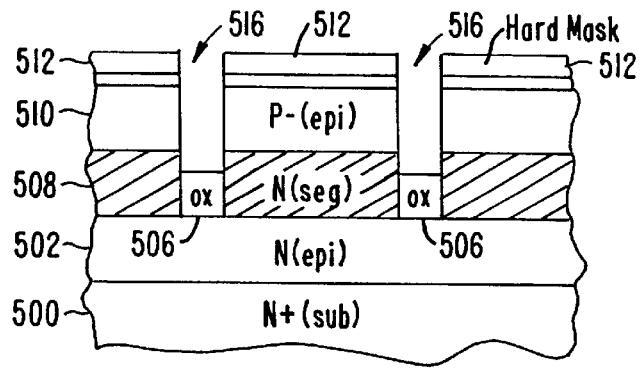

Next, in step 416, an anisotropic etch is performed through trench opening accesses 514 to form trenches 516 that terminate at the top of the oxide pillars 506. The structure following the anisotropic etch is shown in FIG. 5H.

In step 418, a sacrificial oxidation (0.02 $\mu$m) and wet etch is performed, followed by a hydrogen anneal (~3 min. @ 1060° C.) and an argon anneal (~20 min. @ 1100° C.) to repair etch damage, round upper and bottom corners of the trenches 516 and prepare trench sidewalls for gate oxidation.

In step 420, a gate oxide 518 is formed over the sidewalls of the trenches 516 to a thickness of about 0.4 $\mu$m and in step 422 the trenches 516 are filled with doped polysilicon 520.

Figure 5I:
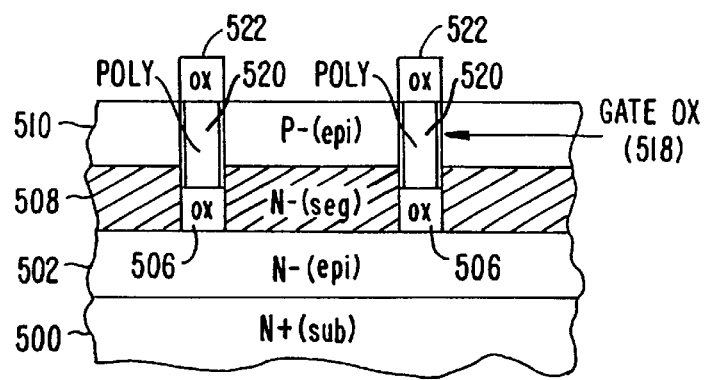

In step 424, dielectric isolation regions 522 are formed over the polysilicon-filled trenches 516. These dielectric isolation regions 522 will function to isolate the gate from the source once the source is formed. The structure following step 424 is shown in FIG. 5I.

After the dielectric isolation regions 522 are formed, in step 426 an optional sacrificial oxidation (0.02 $\mu$m) and wet etch are both performed, followed by an optional hydrogen anneal (~1 min. @ 1060° C.) to prepare the exposed surface of body layer 510 for growth of a source region.

Figure 5J:
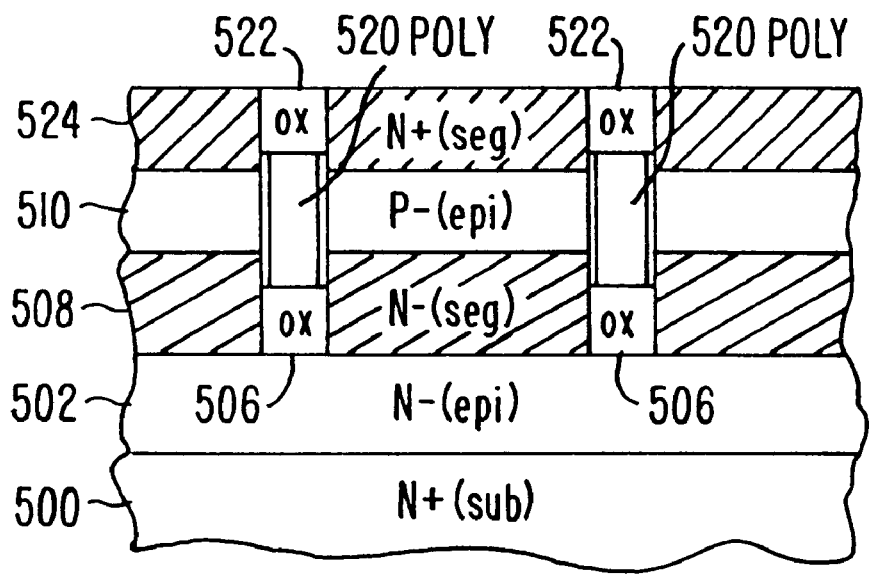

In step 428, a source region 524 is grown using SEG to a thickness that just meets the tops of the dielectric isolation regions 522, thereby forming a substantially planar surface. If a higher dopant concentration than what can be achieved with SEG in situ doping is needed, a standard implantation process could be used to increase the dopant concentration. The structure following step 428 is shown in FIG. 5J. An alternative to the SEG technique used in step 428 is to use a non-selective epitaxial deposition approach to form the source region. This source region would then be patterned and etched using standard photolithography, after which oxide would be deposited in the etched areas to form the dielectric isolation regions.

Next, in step 430 a heavy body region 526 is formed using standard photolithography and implant and drive techniques. Finally, in step 432 a metal layer (~5 $\mu$m) is deposited over the substantially planar surface.

Figure 6A:
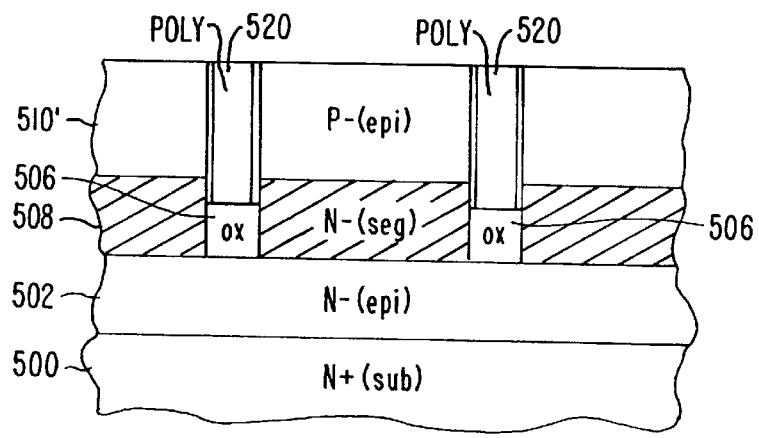
FIGS. 6A–6C are cross-sectional illustrations of a trench MOSFET showing the formation of source, heavy body and dielectric caps using an alternative embodiment of the method producing the structures shown in FIGS. 5I–5K.

In an alternative embodiment, steps 428 through 432 can be replaced with the following steps 428' through 432'. In step 428' the body region 510' is further grown to a thickness that will allow the source and heavy body to be implanted in subsequent processing steps. The structure after performing step 428' is shown in FIG. 6A.

Figure 6B:
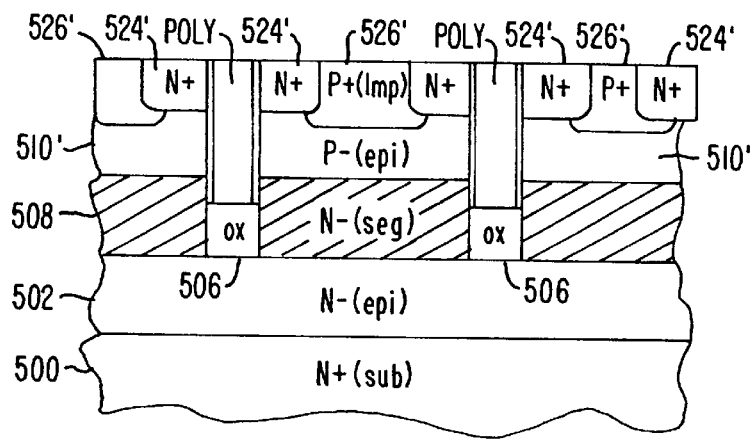

In step 430', source region 524' and heavy body region 526' are formed using standard patterning, implanting and driving. The structure following step 430' is shown in FIG. 6B.

Figure 6C:
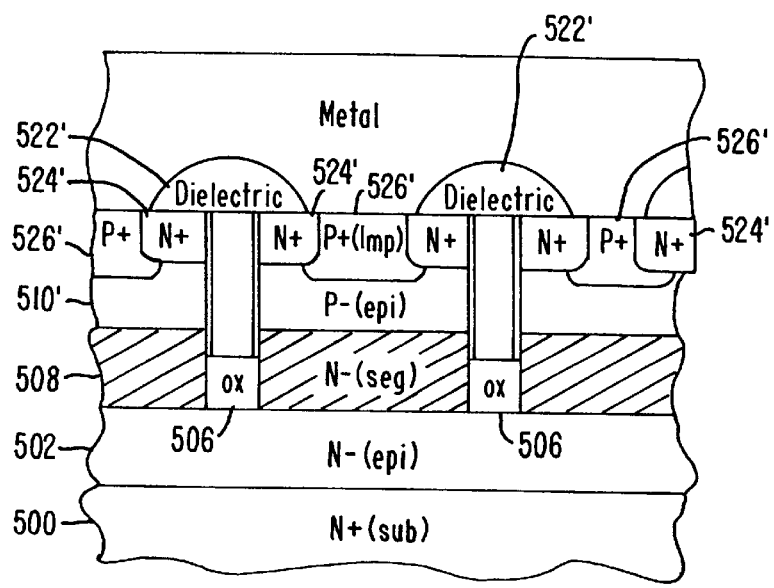

Finally, in step 432' a dielectric layer is deposited, masked, etched and flowed to create a dielectric isolation region 522' between the source and gate and a metal layer is deposited over the structure as shown in FIG. 6C.

Figure 5K:
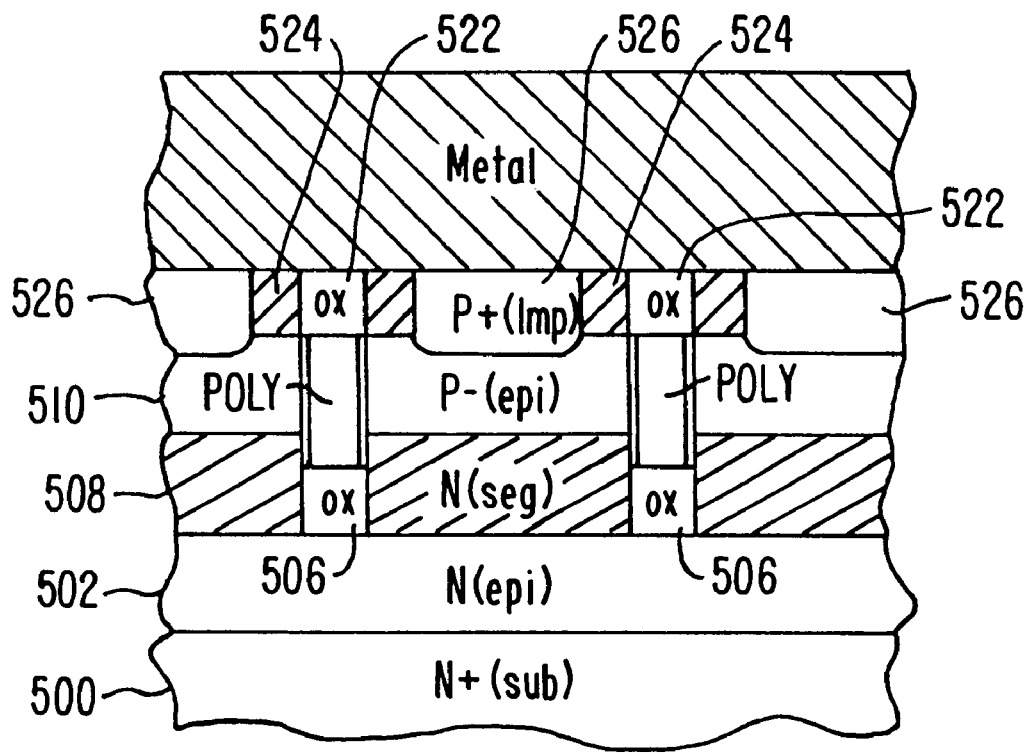

Comparing FIG. 5K to FIG. 6C it is seen that dielectric isolation region 522' is positioned over the source region 524' in the embodiment shown in FIG. 6C, whereas the dielectric isolation region 522 is positioned within the source region 524 for the embodiment shown in FIG. 5K. This difference provides the embodiment shown in FIG. 5K with at least two advantages over the embodiment shown in FIG. 6C. First, because the dielectric isolation regions 522 are within the source region layer 524 and are not spaced laterally over it, a reduction in trench pitch can be realized to a larger degree than can be realized for the embodiment shown in FIG. 6C. Second, since the dielectric isolation region 522 is planar to the source region 524, better metal step coverage can be realized than can be for the embodiment shown in FIG. 6C.

In summary, the present invention provides a novel method of creating a thermally grown oxide of any thickness at the bottom of a silicon trench for a trench DMOS transistor. Unlike prior art attempts, the oxide is grown prior to formation of the trench. A selective epitaxial growth (SEG) process is used to form an epitaxial layer around the oxide pillars. Trenches are then patterned and etched in alignment with the pillars such that the trenches terminate on the top of the oxide pillars.

Although the invention has been described in terms of a preferred methods and structure, it will be obvious to those skilled in the art that many modifications and alterations may be made to the disclosed embodiments without departing from the invention. Hence, these modifications and alterations are intended to be considered as within the spirit and scope of the invention as defined by the appended claims.

What is claimed is:

1. A method of forming a trench in a semiconductor substrate, comprising the steps of:

providing a semiconductor substrate;

forming a pillar of dielectric material on the substrate, the pillar having a top surface and a predetermined thickness;

forming a semiconductor layer, by selective epitaxial growth (SEG), on the substrate and around the pillar to the point of coalescence;

forming a masking layer over the semiconductor layer, the masking layer having a trench opening access that exposes a portion of an upper surface of the semiconductor layer and being in substantial vertical alignment with the pillar; and forming a trench through the trench opening access by anisotropically etching the semiconductor layer down to the top surface of the pillar.

2. The method of claim 1, wherein the semiconductor layer is comprised of a lower portion grown by selective epitaxial growth and an upper portion grown by non-selective epitaxial growth.

3. The method of claim 1, wherein the dielectric material is an oxide.

4. The method of claim 3, wherein the oxide is a thermally grown oxide.

5. The method of claim 1 wherein the step of forming a semiconductor layer is performed by providing a silicon source in the presence of a halide compound.

6. A method of manufacturing a trench MOSFET, the method comprising the steps of:

providing a semiconductor substrate having a first conductivity type;

forming a first semiconductor layer over the substrate, the first semiconductor layer having the first conductivity type;

forming a plurality of dielectric pillars across a surface of the first semiconductor, each pillar having a top surface and predetermined height;

forming a second semiconductor layer having the first conductivity type, by selective epitaxial growth (SEG), on the first semiconductor layer and around and over the top surfaces of the pillars;

forming a third semiconductor layer over the second semiconductor layer, the third semiconductor layer having a second conductivity type;

forming a masking layer over the third semiconductor layer, the masking layer defining a plurality of trench opening accesses that expose portions of an upper surface of the third semiconductor layer and being in substantial vertical alignment with the pillars;

forming a plurality of trenches through the trench opening accesses by anisotropically etching the third semiconductor layer and a portion of the second semiconductor layer and down to the top surfaces of the pillars;

removing the masking layer;

lining sidewalls of the trenches with a dielectric material; and lining the dielectric material and filling the trenches with a conductive material.

7. The method of claim 6, further comprising the step of:

forming dielectric caps over openings of the trenches, each cap having a top surface and lateral dimensions that are substantially the same as the lateral dimensions of the trenches.

8. The method of claim 7, further comprising the step of:

forming a fourth semiconductor layer having the first conductivity type over the third semiconductor layer and to a thickness that meets the top surfaces of the caps.

9. The method of claim 6, further comprising the step of:

forming source regions having the first conductivity type next to each trench and within the third semiconductor layer.

10. The method of claim 9, further comprising the step of:

forming heavily doped regions of the second conductivity type in the third semiconductor layer and between the source regions.

11. The method of claim 10, further comprising the step of:

forming a dielectric cap over an opening of each trench and over a portion of the source regions next to each trench.

12. The method of claim 6, wherein the fourth semiconductor layer is formed using selective epitaxial growth.

13. The method of claim 6 wherein the step of forming a second semiconductor layer is performed by providing a silicon source in the presence of a halide compound.

* * * * *

UNITED STATES PATENT AND TRADEMARK OFFICE
CERTIFICATE OF CORRECTION

PATENT NO. : 6,391,699 B1
DATED : May 21, 2002
INVENTOR(S) : Gordon K. Madison and Joelle Sharp It is certified that error appears in the above-identified patent and that said Letters Patent is hereby corrected as shown below:

Column 5,
Line 61, change "0.4" to -- 0.04 --.

Signed and Sealed this

Thirty-first Day of December, 2002

JAMES E. ROGAN
*Director of the United States Patent and Trademark Office*